United States Patent [19]

Ban

[11] 4,433,362

[45] Feb. 21, 1984

[54] REMOTELY CONTROLLABLE ILLUMINATION APPARATUS

[76] Inventor: Itsuki Ban, 3-50-18, Higashi-oizumi, Nerima-ku, Tokyo, Japan

[21] Appl. No.: 251,926

[22] Filed: Apr. 7, 1981

[30] Foreign Application Priority Data

Aug. 18, 1980 [JP] Japan ............................ 55-116095[U]

[51] Int. Cl.³ .............................................. H04M 1/22
[52] U.S. Cl. ....................................... 362/86; 362/96; 362/808; 362/293; 362/145; 362/124; 362/253; 362/276; 362/802; 315/360
[58] Field of Search ................. 362/86, 252, 276, 295, 362/802, 806, 253, 124, 293, 808, 145, 96; 315/360

[56] References Cited

U.S. PATENT DOCUMENTS

| | | | |
|---|---|---|---|
| 1,690,279 | 11/1928 | Craft | 362/811 X |
| 1,930,504 | 10/1933 | Benjafield | 362/86 |
| 3,205,755 | 9/1965 | Sklar | 362/276 X |
| 4,176,581 | 12/1979 | Stuyvenberg | 362/806 X |
| 4,187,532 | 2/1980 | Naffier | 362/276 X |
| 4,276,580 | 6/1981 | Rogers | 362/276 X |
| 4,298,915 | 11/1981 | Goldfarb et al. | 362/295 X |
| 4,305,117 | 12/1981 | Evans | 362/276 X |
| 4,314,316 | 2/1982 | Gertler et al. | 362/86 |

Primary Examiner—Peter A. Nelson
Attorney, Agent, or Firm—Kenway & Jenney

[57] ABSTRACT

A remote controllable illumination apparatus comprising an article with a predetermined shape; a luminous body incorporated in part of the article; an acoustic-electric transducer for producing an output upon receiving the acoustic wave generated from sound generating source; an amplifier circuit for amplifying the output of the acoustic-electric transducer; and a control circuit for controlling the luminous body as to maintain the same lighted for a predetermined period of time in accordance with the output from the amplifier circuit.

7 Claims, 7 Drawing Figures

REMOTELY CONTROLLABLE ILLUMINATION APPARATUS

BACKGROUND OF THE INVENTION

The present invention relates to an illumination apparatus capable of lighting a luminous body which is incorporated in part of an article with a predetermined shape, for a predetermined period of time by remotely controlling the luminous body.

Conventionally, there is known an apparatus capable of maintaining a lamp lighted for a certain period of time after switching off the lamp when a person leaves a room, and thereafter extinguishing the lamp automatically. This apparatus is extremely convenient since the lamp can be kept lighted until one finishes locking the door. However, it has a shortcoming in that one must grope for the switch of the lamp upon entering a dark room.

SUMMARY OF THE INVENTION

It is therefore an object of the present invention to provide an illumination apparatus capable of lighting a luminous body which is incorporated in part of an article of predetermined shape, for a predetermined period of time, by remotely controlling the luminous body, from which illumination apparatus the previously mentioned drawbacks in the prior art apparatus have been successfully eliminated by the present invention.

In order to achieve the above-mentioned object, the present invention provides an illumination apparatus which is operative by remote control and comprises an article of predetermined shape; a luminous body incorporated in part of the article; an acoustic-electric transducer for producing an output upon receiving an acoustic wave generated by a tone generating source; an amplifier circuit for amplifying the output of the acoustic-electric transducer; and a control means for controlling the luminous body so as to maintain the same lighted for a predetermined period of time in accordance with the output from the amplifier circuit.

This and other objects of the invention will become apparent from the following description of embodiments thereof when taken together with the drawings.

DETAILED DESCRIPTION OF THE PREFERRED EMBODIMENTS

Referring to FIGS. 1a to 1d, an embodiment of an illumination apparatus according to the present invention will now be explained.

Figure 1A:
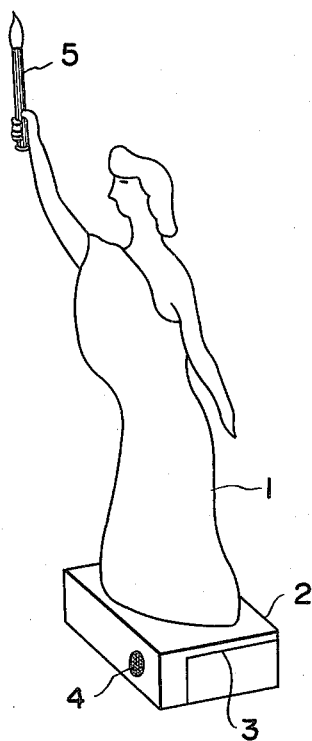
FIGS. 1a to 1d are schematic illustration in explanation of embodiments of an illumination apparatus according to the present invention.
Figure 1B:
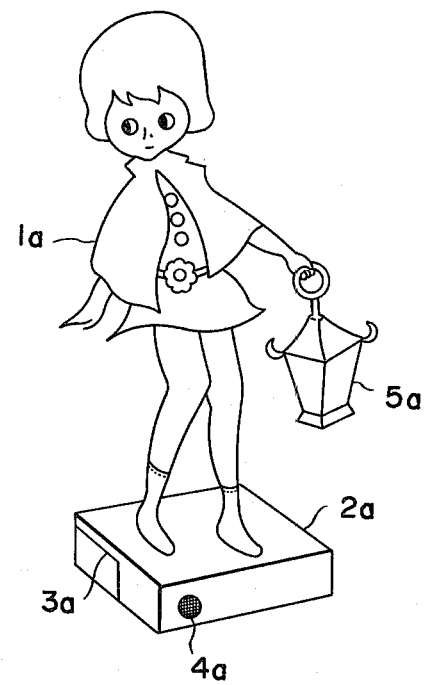

In FIG. 1a and FIG. 1b, reference numerals 2 and 2a are each a base and reference numerals 1 and 1a are each a doll. The dolls 1 and 1a are respectively placed on the base 2 and the base 2a and fixed thereto. Inside the bases 2 and 2a, there are disposed one of the electric circuits as shown in FIGS. 2a and 2b, and batteries which serve as a power source of these illumination apparatuses. As a matter of course, an A.C. power source can be employed instead of those batteries. Reference numerals 3 and 3a each designate a lid which is used when the batteries are replaced. Those lids 3 and 3a can be opened and closed manually. Reference numerals 4 and 4a each designate a window, which is directed to a microphone which serves as acoustic-electric transducer, the reference numeral of which is 9 in FIG. 2a and FIG. 2b. In FIG. 1a, the doll holds a torch type lamp 5, while in FIG. 1b, the doll holds a lantern type lamp 5a. In each of the lamps 5 and 5a, there is enclosed an electric bulb which serves as a luminous body. In FIG. 2a and FIG. 2b, these electric bulbs are represented by reference numeral 21. In the embodiments shown in FIG. 1a and FIG. 1b, the doll is employed. Instead of the dolls, toy animals, such as dogs and Mickey Mouse can also be used. For example, a toy raccoon dog with a Japanese lantern in hand can be used, an electric light enclosed therein. Also, this apparatus might be useful as an attractive ornament as will now be explained by referring to FIGS. 1(c) and 1(d).

Figure 1C:
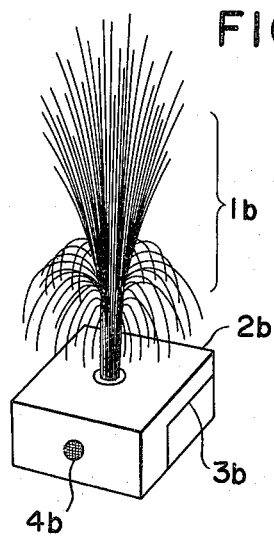
Figure 1D:
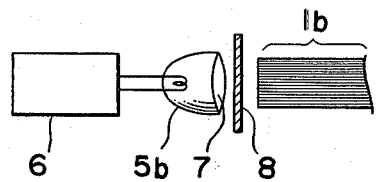
Figure 2A:
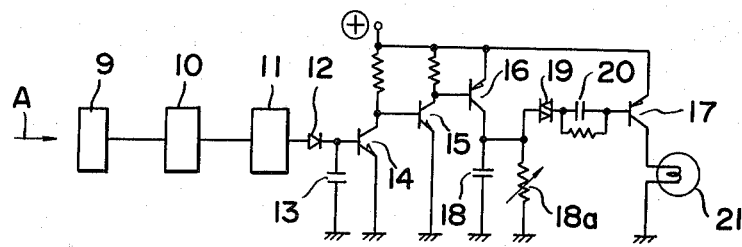
FIGS. 2a and 2b are the diagrams of electric circuits for use in the present invention.
Figure 2B:
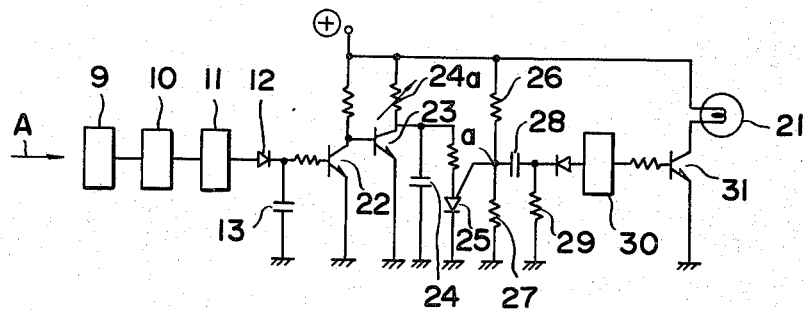

In FIG. 1c and FIG. 1d, reference numeral 2b designates a base to which the root portion of a bundle of optical fibers 1b, capable of forming beautiful optical patterns, is fixed. The optical patterns formed by the optical fibers are available in the form of flowers, letters, etc. in addition to the patterns shown in FIG. 1c. In the base 2b, there are disposed a lid 3b for allowing replacement of batteries and a window 4b which is directed to a microphone which serves as acoustic-electric transducer (the reference numeral of which is 9 in FIG. 2). As shown in FIG. 1d, inside the base 2b, there are disposed a control circuit 6 (refer to FIGS. 2a and 2b) and an electric bulb 5b (the reference numeral of which is 21 in FIGS. 2a and 2b) which serves as luminous body and is remotely controlled by the control circuit 6.

Furthermore, a lens 7 for condensing the rays of light from the electric bulb 5b, a filter 8 for dividing the rays of light into the rays of light with different colors and other necessary members are incorporated. The filter 8 includes a variety of colored portions and is rotated by a motor (not shown). Because of the above-mentioned construction, the divided rays of light with different colors each enter the cross sectional surface at the bottom of the optical fibers 1b. The rays of light entered repeat their total reflection in the optical fibers 1b and are released from the cross section of the tip of each optical fiber or from the cross section on the way to the tip, so that beautiful optical patterns are formed. Therefore, this apparatus is also useful as an ornament.

Figure 3:
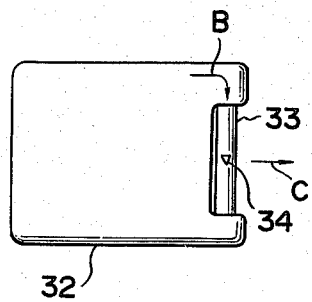
FIG. 3 is an illustration of a tone generating apparatus for use in the present invention.

Referring to FIG. 3, there is shown a whistle device which serves as a sound source. In the figure, reference numeral 32 designates a rubber bag. A plastic whistle 33 is fixed to a concave portion on the right in the figure. When the bag 32 is vertically squeezed with the hands, the air in the bag 32 is pushed into the whistle 33 from the direction of the arrow B and is ejected out of a notch portion 34 of the whistle 33 in the direction of the arrow C, thus generating sounds. The whistle 33 is also selected that the frequencies of the generated acoustic waves are in the range of about 10 to 20 KHz. The frequencies in that range are near the upper limit of the frequencies of audible sounds. The same object can be achieved by blowing air into the whistle 33 directly from the mouth, with the bag 32 eliminated. In FIG. 3, an acoustic wave signal projected in the direction of the arrow C enters the microphone 9 (shown in FIG. 2a)

from the direction of the arrow A. The output of the microphone 9 is amplified by an amplifier circuit 10. The output from the amplifier circuit 10 is input to a filter circuit 11 where the acoustic wave components having frequencies not greater than 5 KHz are removed. Therefore, noises with frequencies not greater than 5 KHz, which may be generated from the operator or from thereabouts, are completely removed. The output from the filter circuit 11 is smoothed by both a diode 12 and a condenser 13 and, at the same time, the output is reversed by transistors 14 and 15. When there is no input of acoustic wave signal from the direction of the arrow A, a transistor 16 is made conductive, so that a condenser 18 is charged. When there is an input of acoustic wave signal from the direction of the arrow A, the transistor 16 is made non-conductive, so that the condenser 18 begins to discharge through a resistor 18a. In 0.5 seconds, a trigger diode 19, which works as a detection circuit, is subject to break-down. As a result, a transistor 17, which serves as a lighting control circuit, is made conductive, so that the electric bulb 21 is lighted. In about 10 seconds, a condenser 20 is charged, so that the base current of the transistor 17 is used up and the transistor 17 is made non-conductive, turning off the electric bulb 21.

The electric circuit shown in FIG. 2b is a modification of the electric circuit shown in FIG. 2a. In FIG. 2b, the same reference numerals as those in FIG. 2a respectively represent identical members. Therefore, the explanation of those identical members is omitted here. The signal, smoothed by the diode 12 and the condenser 13, is reversed by transistors 22 and 23. When there is no input of acoustic wave signal from the direction of the arrow A, the transistor 23 is made conductive, so that a condenser 24 begins to discharge. When an acoustic wave signal is input from the direction of the arrow A, the transistor 23 is made non-conductive. Accordingly, the condenser 24 begins to be charged through a resistor 24a. In about 0.5 seconds, the potential of the condenser 24 becomes higher than the potential at a point a, at which the voltage is divided by resistors 26 and 27. As a result, a PUT (Programmable Unijunction Transistor) 25 is made conductive, so that a pulse signal is applied to the point a. This pulse signal is differentiated by a condenser 28 and a resistor 29 and is then input to a monostable multivibrator circuit 30, producing an output therefrom. This output makes a transistor 31 conductive which works as a lighting control circuit, effecting energization of the electric bulb 21. If the time constant of the monostable multivibrator circuit 30 is set in such a manner that the output of the monostable multivibrator circuit 30 is reversed in about 10 seconds, the transistor 31 becomes non-conductive in about 10 seconds and the electric bulb 31 is automatically turned off with such timing.

As can be seen from the above explanation, when the whistle 33 in FIG. 3 is continuously blown for 0.5 seconds or longer, the electric bulb in FIG. 1 is lighted and automatically turned off in 10 seconds. Therefore, if an impulsive sound which lasts for less than 0.5 seconds is applied, no malfunction takes place in the illumination apparatus. The above-mentioned periods of time, such as 0.5 seconds and 10 seconds, can be selected as desired. Instead of the electric circuit in FIG. 2, conventional acoustic switching circuits can be employed. The indispensable condition for using such a conventional circuit is that it has to include an automatic turning off circuit for turning off the lamp automatically in a predetermined period of time. Otherwise, if the lamp is lighted by an error signal, the batteries may be used up soon and therefore, such an apparatus cannot be used in practice. The use of such an automatic turning off circuit is important also for the following reasons:

In the apparatus according to the present invention, the frequencies of the acoustic wave used for remote control are extremely close to the frequencies of audible sounds. Therefore, there are many opportunities of error signals being inputted, but an electric circuit for completely eliminating such error signals is very expensive and not suitable for practical use. In the apparatus according to the present invention, since the acoustic wave with relatively low frequencies is employed for remote control of the apparatus, that remote contol can be done by use of a method as will now be described.

The device for actuating the illumination apparatus as shown in FIG. 3 is small in size and light in weight and therefore portable. However, if that device is misplaced, the illumination apparatus cannot be controlled by other means. If this takes place, such convenient illumination apparatus becomes a very inconvenient apparatus. If the apparatus is designed so as to be activated by human voices, such inconvenience can be completely obviated. However, it becomes extremely difficult to eliminate the input of error signals. Such inconvenience, however, can be completely avoided by using fricatives which are generated when air is exhaled passing between the upper jaw and the tongue. The frequencies of such sounds are rather high and are in the range of 6 to 8 KHz. When using such sounds, the chances of error signals being input can be significantly eliminated.

When such a method is employed and the apparatus is designed so as to be activated by the above-mentioned fricatives, the electric lamp as shown in FIG. 1a or FIG. 1b can be lighted for about 10 seconds by the fricatives from the mouth, so that the lamp in the room can be surely lighted during that period of time. For practical use, after the door is opened, the fricatives are generated from the mouth, lightening the electric lamp in FIG. 1a or FIG. 1b. While that lamp is lighted, the room lamp can be lighted by closing its switch. Since such particular fricatives are employed as the acoustic source, the remote control is quite simple, and there is no risk of forgetting to bring the acoustic source or misplacing the same. Since the lamp is automatically turned off in a predetermined period of time after it is lighted, the shortcoming of the batteries being used up by an error signal can be eliminated. If necessary, a whistle capable of generating the sounds with the frequencies in the range of 10 to 20 KHz can be used as the acoustic source. Furthermore, the illumination apparatus according to the present invention is useful as an ornament or accessories of the room if it is designed in the shape of dolls or of toy animals.

Furthermore, this apparatus can be placed beside a clock to tell the time in the dark room at night, since the apparatus is lighted by the above-mentioned sounds and that lighting for illuminating the clock continues for 10 to 20 seconds. Moreover, if the apparatus is placed beside a telephone, it can be actuated by the rining of the telephone to illuminate the telephone at night.

Thus, there is provided in accordance with the invention a remote controllable illumination apparatus which has the advantage discussed above. The embodiments described are intended to be merely exemplary and those skilled in the art will be able to make variations and modifications in them without departing from the spirit and scope of the invention. All such modifications and variations are contemplated as falling within the scope of the claims.

What is claimed is:

1. A remote controllable illumination apparatus comprising:
   a luminous body;
   a microphone for producing an electric output signal upon receiving an acoustic signal generated from a remote sound generating source;
   a filter circuit for removing frequencies corresponding to less than 5 KHz;
   an amplifier circuit for amplifying said output signal of said microphone;
   and
   a lighting control circuit means for turning on said luminous body responsive to said amplified output signal and for turning off said luminous body after a predetermined period of time.

2. A remote controllable illumination apparatus as claimed in claim 1, further comprising a whistle capable of generating sounds with frequencies close to the upper limit of frequencies of audible sounds, employed as a sound generating source.

3. A remote controllable illumination apparatus as claimed in claim 1, further comprising a fricative which emits an acoustic signal responsive to air exhaled between the upper jaw and the tongue, employed as a sound generating source.

4. A remote controllable illumination apparatus as claimed in claim 1, further comprising:
   an electric circuit including a condenser in which charging or discharging is effected through the output of said amplifier circuit when no acoustic wave is being received, and in which condenser the charging or discharging is stopped when an acoustic wave is being received;
   a detection circuit for detecting when the charging or discharging of said condenser reaches a predetermined value; and
   said lighting control circuit for lighting said luminous body for a predetermined period of time being responsive to said detection circuit.

5. The remote controllable illumination apparatus of claim 1 wherein said luminous body is a light bulb 6. The remote controllable illumination apparatus of claim 4 wherein said luminous body is a light bulb.

7. The remote controllable illumination apparatus of claim 1 wherein said luminous body is incorporated into a figure or an ornament.

* * * * *